United States Patent
Minobe et al.

(10) Patent No.: US 7,684,780 B2
(45) Date of Patent: Mar. 23, 2010

(54) SEMICONDUCTOR DEVICE, RADIO TERMINAL DEVICE, AND RADIO COMMUNICATION EQUIPMENT

(75) Inventors: Kenichi Minobe, Kawasaki (JP); Atsushi Matsuda, Kawasaki (JP); Masashi Okubo, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 877 days.

(21) Appl. No.: 11/402,936

(22) Filed: Apr. 13, 2006

(65) Prior Publication Data

US 2006/0183456 A1     Aug. 17, 2006

(51) Int. Cl.
*H04B 1/28* (2006.01)

(52) U.S. Cl. .................. 455/333; 455/343.1; 455/550.1

(58) Field of Classification Search ................. 455/131, 455/313, 323, 333, 343.1, 550.1
See application file for complete search history.

(56) References Cited

U.S. PATENT DOCUMENTS

| | | | |
|---|---|---|---|
| 5,666,355 A | 9/1997 | Huah et al. | |
| 6,154,165 A | 11/2000 | Gross, Jr. | |
| 2002/0142745 A1* | 10/2002 | Kang et al. | 455/232.1 |
| 2004/0102173 A1* | 5/2004 | Darabi | 455/307 |
| 2004/0180634 A1* | 9/2004 | Kenington et al. | 455/113 |

FOREIGN PATENT DOCUMENTS

| | | |
|---|---|---|
| EP | 0 273 365 A2 | 7/1988 |
| EP | 0 425 878 A2 | 5/1991 |
| JP | 62-231507 A | 10/1987 |
| JP | 63-167514 A | 7/1988 |
| JP | 3-24729 U | 3/1991 |
| JP | 6-140873 A | 5/1994 |
| JP | 6-334463 A | 12/1994 |
| JP | 9-511882 A | 11/1997 |
| JP | 10-224243 | 8/1998 |
| JP | 11-74792 A | 3/1999 |
| JP | 11-186952 A | 7/1999 |
| JP | 2000-013279 | 1/2000 |
| JP | 2000-101433 A | 4/2000 |
| JP | 2002-500490 | 1/2002 |
| JP | 2003-133981 A | 5/2003 |
| WO | 99/34625 A1 | 7/1999 |

\* cited by examiner

*Primary Examiner*—Nhan T Le
(74) *Attorney, Agent, or Firm*—Arent Fox LLP

(57) ABSTRACT

A semiconductor device includes a first analog circuit (53) adapted to a first performance, and a second analog circuit (55) realizing a second performance higher than the first performance by cooperating with the first analog circuit. It becomes possible to switch circuit characteristics appropriately in accordance with a requested performance while suppressing an increase of a circuit scale, by operating the first analog circuit and interrupting a power supply to the second analog circuit when the first performance is requested, and by operating the first analog circuit and the second analog circuit together when the second performance is requested to thereby share the first analog circuit.

16 Claims, 6 Drawing Sheets

F I G. 7
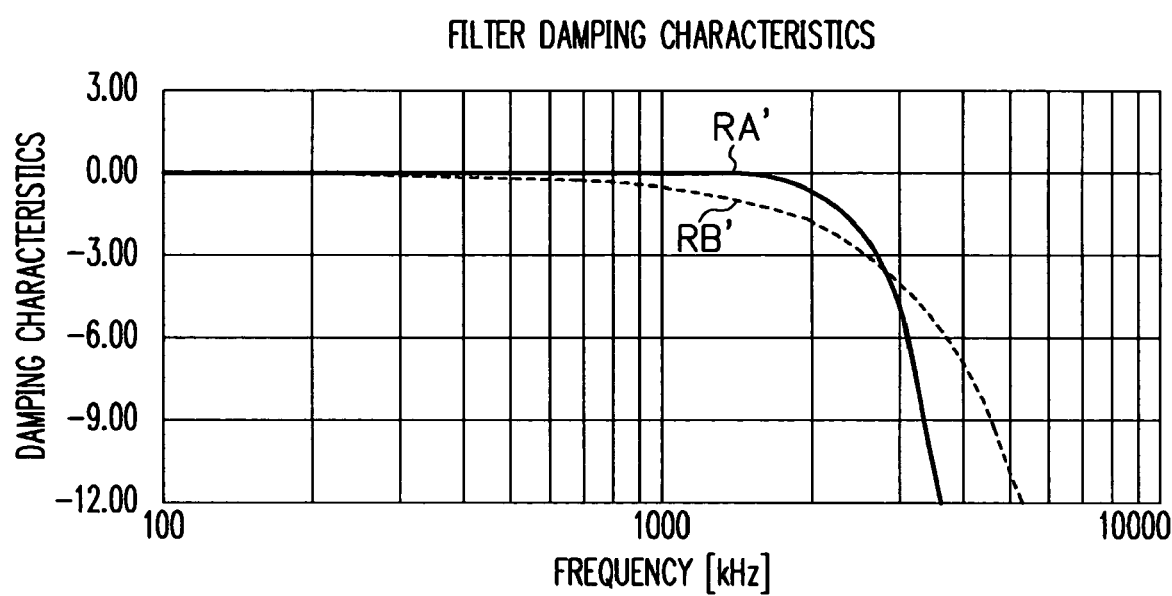

SEMICONDUCTOR DEVICE, RADIO TERMINAL DEVICE, AND RADIO COMMUNICATION EQUIPMENT

CROSS-REFERENCE TO RELATED APPLICATIONS

This application is based upon prior International Patent Application No. PCT/JP2003/14289, filed on Nov. 11, 2003, the entire contents of which are incorporated herein by reference.

TECHNICAL FIELD

The present invention relates to a semiconductor device, a radio terminal device, and a radio communication equipment, and in particular, to the semiconductor device, the radio terminal device, and the radio communication equipment capable of switching circuit characteristics thereof.

BACKGROUND ART

As shown in FIG. 8, a conventional digital radio terminal is generally composed of an RF portion 80, an AFE (Analog Front End) portion 90, and a DBB (Digital Base Band) portion 100. The RF portion 80 has an antenna 81, a transmission amplifier portion 82 and a receiving amplifier portion 83 respectively including a mixer, a power amplifier, and so on, and a duplexer circuit 84.

Besides, the AFE portion 90 converting a signal into analog-digital mutually is composed of a receiving portion and a transmission portion, and has a receiving filter 91, a receiving ADC (Analog-Digital Converter) 92, a transmission DAC (Digital-Analog Converter) 93, and a transmission filter 94. The DBB portion 100 performing a digital signal process has a signal processing portion 101.

In a radio terminal shown in FIG. 8, an analog signal received at the antenna 81 is amplified and so on at the receiving amplifier portion 83, and thereafter, a filter process is performed at the receiving filter 91. Further, the filter processed analog signal is converted into a digital signal by the ADC 92, to be supplied to the signal processing portion 101.

Besides, the digital signal to be transmitted, outputted from the signal processing portion 101 is converted into an analog signal by the DAC 93, and thereafter, the filter process is performed at the transmission filter 94. Further, a predetermined process such as an amplification is performed at the transmission amplifier, and thereafter, it is transmitted via the antenna 81.

Here, when the radio terminal corresponding to two radio methods is constituted, it is generally constituted so that two circuits corresponding to one radio method shown in FIG. 8 are disposed in parallel as shown in FIG. 9. Incidentally, in FIG. 9, the same numerals and symbols are used for a block and so on having the same function with the block and so on shown in FIG. 8. In FIG. 9, an RF-A80, an AFE-A90, and the signal processing portion 101 connected to the AFE-A90 is corresponding to one radio method, and an RF-B80, an AFE-B90, and the signal processing portion 101 connected to the AFE-B90 is corresponding to another radio method.

Besides, as a constitution of the radio terminal corresponding to plural radio methods, there are the one in which a broad-band filter and a low-band filter are switched in accordance with the radio method (for example, refer to Japanese Patent Application Laid-open No. Hei 10-224243 (Patent Document 1)), the one in which a band width is changed by changing a sampling frequency of a digital filter (for example, refer to Translated National Publication of Patent Application No. 2002-500490 (Patent Document 2)), the one in which a filter is changed by a switching of softwares to change the band width (for example, refer to Japanese Patent Application Laid-open No. 2000-13279 (Patent Document 3)), and so on.

However, when the radio terminal is constituted as shown in FIG. 9, the number of parts constituting the radio terminal becomes very large, and a miniaturization of the radio terminal becomes difficult because an area required for mounting the parts increases. Besides, a cost necessary for manufacturing (parts cost and so on) becomes expensive.

As a method intending to reduce the number of parts and miniaturize the radio terminal with respect to the constitution shown in the FIG. 9, a constitution in which the AFE portion and the DBB portion are shared with two radio methods, is conceivable. However, requested characteristics in accordance with the radio methods (damping characteristics of the transmission/receiving filters, operating frequencies and resolution performances of the ADC and the DAC, and so on) are different, and therefore, it is necessary to use the filter, the ADC, and the DAC agreed with the highest specification among the radio methods when the AFE portion is shared.

Consequently, when a circuit is shared, electric power is wasted because it is operated with a performance more than required depending on the radio method operated actually. Besides, there is a case when the damping characteristics of the filter become insufficient depending on the selected radio method, and a further digital filter process may be required depending on the radio method to thereby waste electric power.

[Patent Document 1] Japanese Patent Application Laid-open No. Hei 10-224243

[Patent Document 2] Translated National Publication of Patent Application No. 2002-500490

[Patent Document 3] Japanese Patent Application Laid-open No. 2000-13279

SUMMARY OF THE INVENTION

The present invention is made in consideration of the above-mentioned circumstances, and an object thereof is to make it possible to switch circuit characteristics appropriately in accordance with a communication environment while suppressing an increase of a circuit scale.

A semiconductor device according to the present invention includes: a first analog circuit in which circuit characteristics are adapted to a first performance; and a second analog circuit realizing a second performance higher than the first performance by cooperating with the first analog circuit, and wherein a power supply to the second analog circuit is interrupted when the first performance is requested.

According to the present invention, the first performance is realized by operating the first analog circuit and interrupting the power supply to the second analog circuit, and the second performance is realized by operating the first analog circuit and the second analog circuit together. Consequently, it is possible to switch the circuit characteristics appropriately in accordance with a requested performance while suppressing the increase of the circuit scale by sharing the first analog circuit. Besides, a power consumption can be reduced by interrupting the power supply to the analog circuit which is not necessary to be operated in accordance with the requested performance.

Besides, it may be constituted so that the first analog circuit is operated and the power supply to the second analog circuit is interrupted in case of a first radio method, and the first analog circuit and the second analog circuit are operated together in case of a second radio method in accordance with the radio method. In such a case, the circuit characteristics can be switched appropriately to adapt to the requested performance in accordance with the radio method.

Further, it may be constituted so that a state in which the first analog circuit is operated and the power supply to the second analog circuit is interrupted, and a state in which the first analog circuit and the second analog circuit are operated together, are switched in accordance with a quality of a receiving signal in a radio communication. In such a case, it is possible to switch the circuit characteristics appropriately and to improve the quality of the receiving signal.

BRIEF DESCRIPTION OF THE DRAWINGS

FIG. 7 is a view showing an example of filter damping characteristics according to a second embodiment;

DETAILED DESCRIPTION OF THE PREFERRED EMBODIMENTS

Hereinafter, embodiments of the present invention are described based on the drawings.

First Embodiment

Figure 1:
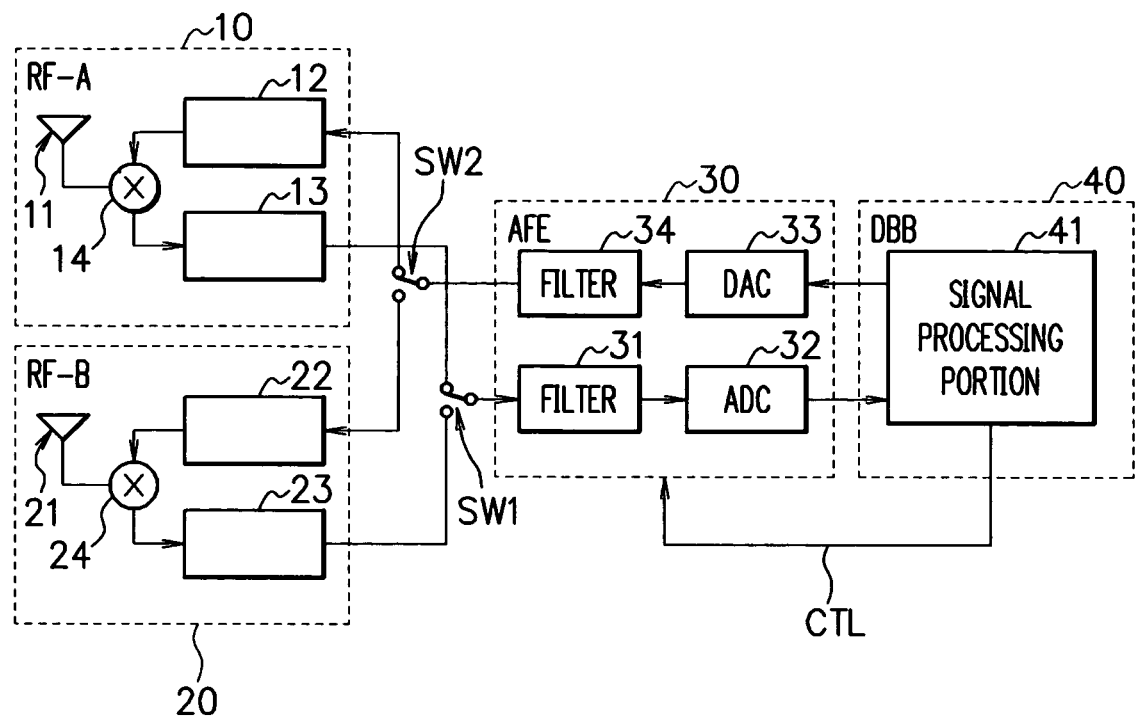
FIG. 1 is a block diagram showing a configuration example of a radio terminal device applying a semiconductor device according to a first embodiment of the present invention.

FIG. 1 is a block diagram showing a configuration example of a radio terminal device applying a semiconductor device according to a first embodiment of the present invention. The radio terminal device according to the first embodiment corresponds to plural radio methods (two radio methods in the following description), and circuit characteristics thereof are switched in accordance with the radio method in operation.

As shown in FIG. 1, the radio terminal device according to the first embodiment has an RF (Radio Frequency) portion (RF-A) 10 of a first radio method, an RF portion (RF-B) 20 of a second radio method, an AFE (Analog Front End) portion 30, a DBB (Digital Base Band) portion 40, and switches SW1, SW2.

The RF-A10 has an antenna 11, a transmission amplifier portion 12 and a receiving amplifier portion 13 respectively including a mixer, a power amplifier, and so on, to perform an amplification and so on of signals, and a duplexer circuit 14. The RF-B20 is constituted as same as the RF-A10, and has an antenna 21, a transmission amplifier portion 22, a receiving amplifier portion 23, and a duplexer circuit 24. The RF-A10 and the RF-B20 perform high frequency signal processes and so on.

The AFE portion 30 is composed of a receiving portion and a transmission portion, and converts an inputted signal into an analog signal and a digital signal mutually. The receiving portion has a receiving filter 31 performing a filter process to an analog signal inputted from the RF portions 10, 20, and a receiving AD converter (analog-digital converter, ADC) 32 converting the filter processed analog signal into a digital signal. Besides, the transmission portion has a transmission DA converter (digital-analog converter, DAC) 33 converting the digital signal inputted from the DBB portion 40 into an analog signal, and a transmission filter 34 performing the filter process to the analog signal obtained by the DA conversion.

Here, the receiving filter 31, the ADC 32, the DAC 33, and the transmission filter 34 are constituted so that circuit characteristics (damping characteristics of the filters 31, 34, resolution performances of the ADC 32 and the DAC 33, and so on) can be switched into the circuit characteristic suitable for a selected radio method, based on a control signal CTL supplied from the DBB portion 40 as described later.

The DBB portion 40 has a signal processing portion 41 and performs a digital signal process such as a base band signal process. The signal processing portion 41 outputs the control signal CTL in accordance with a selected radio method. Besides, the signal processing portion 41 performs a predetermined digital signal process by using the inputted digital signal, and outputs the digital signal obtained by the digital signal process and so on.

Next, operations of the radio terminal device according to the first embodiment are described.

At first, the DBB 40 outputs the control signal CTL to the AFE portion 30 in accordance with the selected radio method. Besides, the DBB 40 controls the switches SW1, SW2 so that an input/output of signals becomes possible between the RF-A10 and the AFE portion 30 when a first radio method is selected. Similarly, the DBB 40 controls the switches SW1, SW2 so that the input/output of the signals becomes possible between the RF-B20 and the AFE portion 30 when a second radio method is selected.

Incidentally, a case when the first radio method is selected is described as an example in the following, but it is the same in the case when the second radio method is selected except a point that the RF-B20 is used.

An analog signal received at the antenna 11 is amplified at the receiving amplifier portion 13, and supplied to the receiving filter 31 via the switch SW1. The analog signal supplied to the receiving filter 31 is performed the filter process at the receiving filter 31, and thereafter, converted from the analog signal into a digital signal at the ADC 32, to be supplied to the signal processing portion 41.

Besides, the digital signal outputted from the signal processing portion 41 is supplied to the DAC 33. The digital signal supplied to the DAC 33 is converted from the digital signal into an analog signal at the DAC 33, and thereafter, performed the filter process at the transmission filter 34. The filter processed signal is supplied to the transmission amplifier 12 via the switch SW2, performed a predetermined process such as an amplification at the transmission amplifier 12, and thereafter, transmitted via the antenna 11.

Next, the filters 31, 34, the ADC 32, and the DAC 33 held by the AFE portion 30 are described concretely.

Filters 31, 34

At first, the filters 31, 34 are described.

Figure 2:
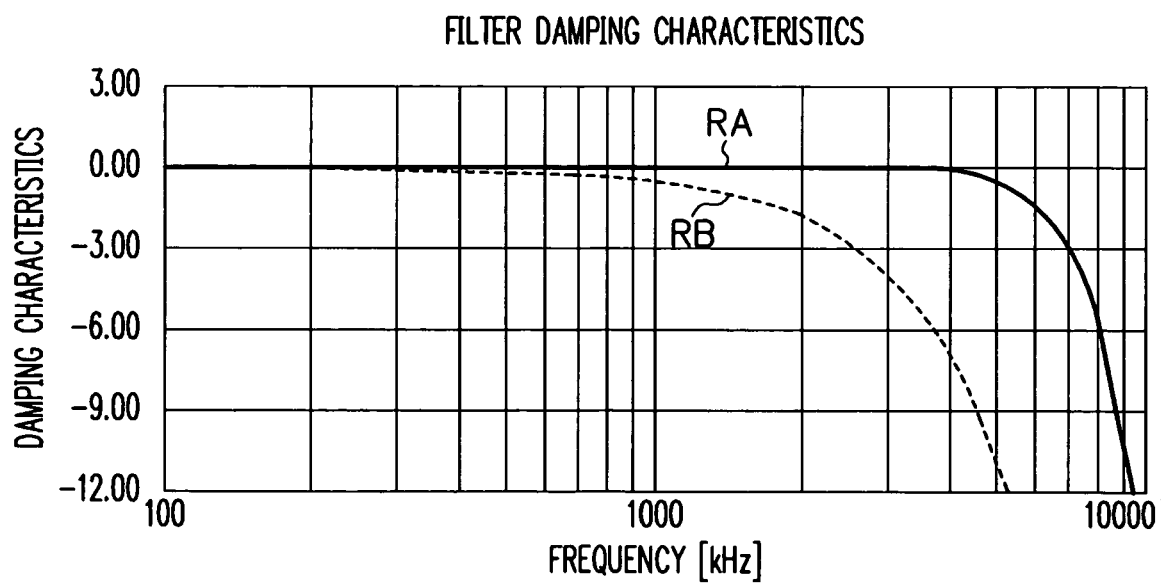
FIG. 2 is a view showing an example of filter damping characteristics requested in different radio methods.

The damping characteristics of the filter as shown in FIG. 2 are respectively requested in two radio methods according to the present embodiment. Namely, a quintic filter (low-pass filter) having a cut-off frequency (Fc) of 7 MHz as shown by a solid line "RA" is requested in the first radio method, and a secondary filter (low-pass filter) having the cut-off frequency of 2.5 MHz as shown by a dotted line "RB" is requested in the second radio method. Incidentally, a horizontal axis represents frequencies and a vertical axis represents damping characteristics in FIG. 2.

Here, a high degree filter generally has a larger power consumption than a low degree filter. The secondary filter for the second radio method is superior from a point reducing the power consumption, but a signal with a frequency required in the first radio method is interrupted if the filter for the second radio method is used. On the other hand, when the quintic filter for the first radio method is used, extra electric power is consumed when the second radio method is selected.

Figure 3:
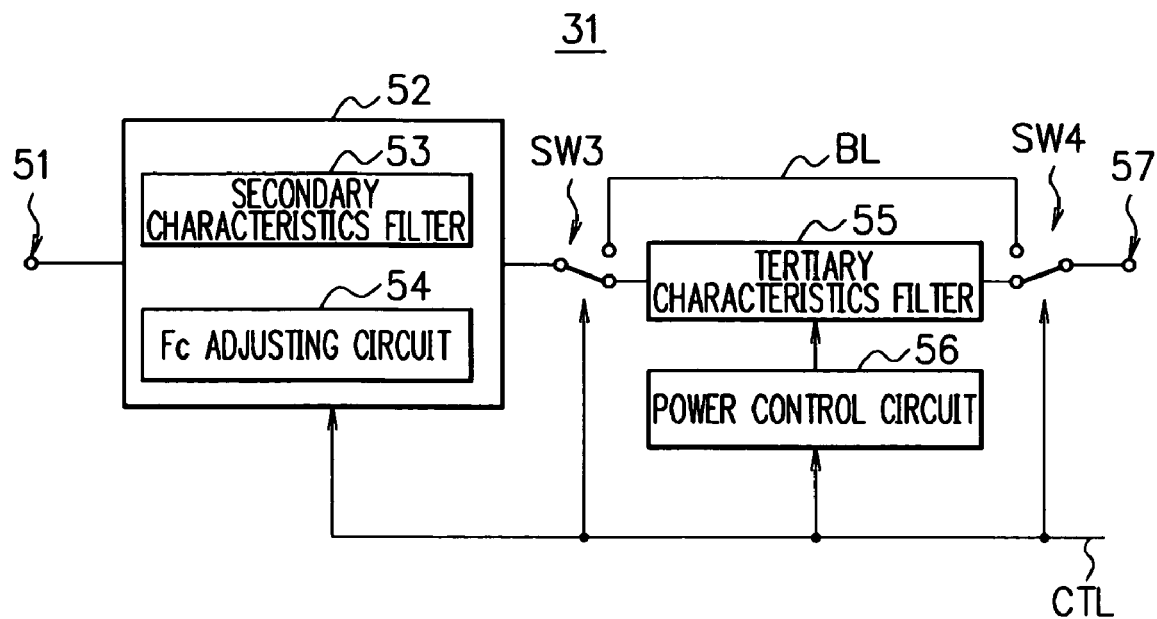
FIG. 3 is a block diagram showing a configuration example of a filter according to the first embodiment.

Consequently, in the present embodiment, the filters 31, 34 are composed of a secondary characteristics filter and a tertiary characteristics filter as shown in FIG. 3. It is controlled so that both the secondary characteristics filter and the tertiary characteristics filter are used when the first radio method is selected, and only the secondary characteristics filter is used when the second radio method is selected.

Here, for example, an input of a primary filter is Vin, then an output Vout1 can be represented as follows.

$$Vout1 = (1/(sRC)) \times Vin$$

Further, when the output is inputted to the same primary filter, an output Vout2 thereof becomes to be the following and the secondary characteristics can be obtained.

$$Vout2 = (1/(sRC)) \times Vout1 = (1/(sRC)) \times (1/(sRC)) \times Vin$$

Namely, it is possible to constitute an n-degree characteristics filter by connecting the primary filters for n-stages in series. Consequently, the secondary characteristics filter and the tertiary characteristics filter connected in series are used together, to thereby realize "the secondary+the tertiary=a quintic characteristics filter".

FIG. 3 is a view showing a configuration example of the filter 31.

In FIG. 3, a reference numeral 51 denotes an input node of the filter 31. A reference numeral 52 denotes a filter portion at a low-specification side, and has a secondary characteristics filter (analog filter) 53 and a cut-off frequency (Fc) adjusting circuit 54 adjusting the cut-off frequency based on the control signal CTL. A reference numeral 55 denotes a tertiary characteristics filter (analog filter), and a reference numeral 56 is a power control circuit switching whether a power source is supplied to the tertiary characteristics filter 55 or not in accordance with the control signal CTL.

Besides, a SW3 is a switch controlled in accordance with the control signal CTL, and it is to selectively supply the tertiary characteristics filter 55 or a bypass line BL with a filter output of the secondary characteristics filter 53. A SW4 is a switch controlled in accordance with the control signal CTL, and it is to selectively supply an output node 57 with the filter output of the secondary characteristics filter 53 via the bypass line BL or the filter output of the tertiary characteristics filter 55.

Incidentally, the secondary characteristics filter 53 may be constituted by connecting two primary filters in series. The tertiary characteristics filter 55 may be constituted by connecting three primary filters in series, or by connecting the primary filter and a secondary filter in series. Besides, the secondary characteristics filter 53 and the tertiary characteristics filter 55 may be operational amplifier filters or Gm-C filters.

Figure 4:
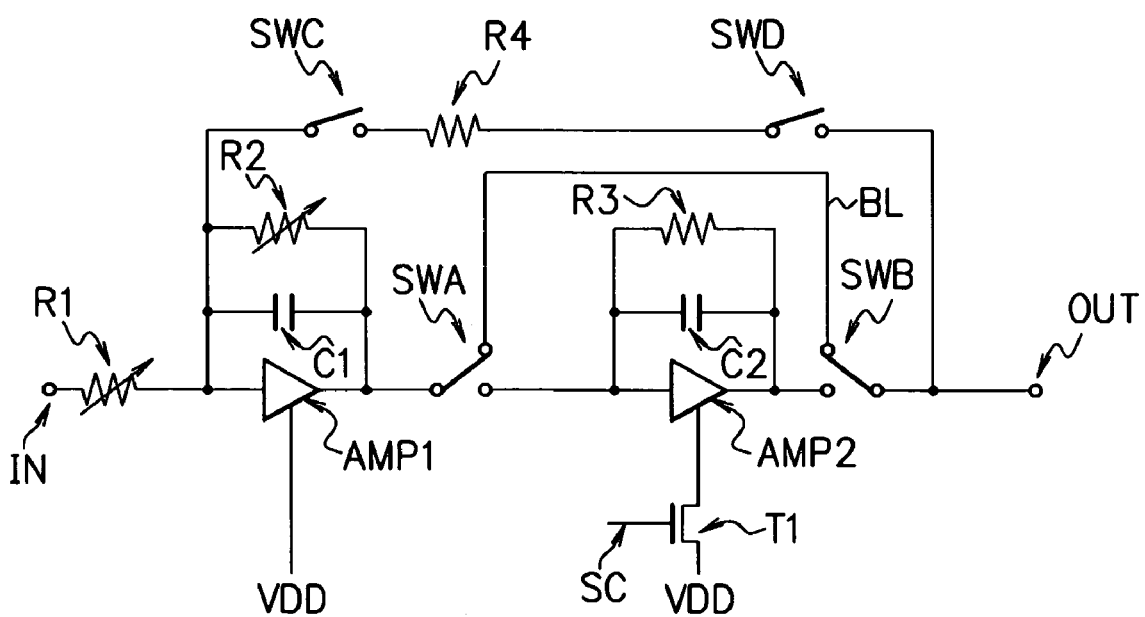
FIG. 4 is a view conceptually showing a principle of operation of the filter shown in FIG. 3.

FIG. 4 is a view for explaining a principle of operation of the filter shown in FIG. 3. Incidentally, the number of degrees of the filter is not considered in FIG. 4 to simplify the description.

In FIG. 4, a positive input of a differential amplifier AMP1 connected to a power source VDD, is connected to the other end of a variable resistor R1 in which one end thereof is connected to an input terminal IN, and a positive output is connected to a first terminal of a switch SWA.

At an interconnection point of the positive input of the differential amplifier AMP1 and the other end of the variable resistor R1, one end of a capacitance C1, one end of a variable resistor R2, and a first terminal of a switch SWC are connected. Besides, at an interconnection point of the positive output of the differential amplifier AMP1 and the first terminal of the switch SWA, the other end of the capacitance C1 and the other end of the variable resistor R2 are connected.

A filter circuit at a front stage is constituted by the differential amplifier AMP1, the capacitance C1, and the variable resistor R2 connected as described above, and this corresponds to the secondary characteristics filter 53 shown in FIG. 3. Besides, the variable resistor R2 corresponds to the cut-off frequency adjusting circuit 54, and the cut-off frequency is adjusted by controlling a resistance value of the variable resistor R2.

Besides, a positive input of a differential amplifier AMP2 connected to the power source VDD via a MOS transistor T1 (P-channel type or N-channel type is no object) in which a control signal SC is supplied to a gate thereof, is connected to a third terminal of the switch SWA, and a positive output thereof is connected to a third terminal of a switch SWB.

At an interconnection point of the positive input of the differential amplifier AMP2 and the third terminal of the switch SWA, one end of a capacitance C2 and one end of a resistor R3 are connected, and at an interconnection point of the positive output of the differential amplifier AMP2 and the third terminal of the switch SWB, the other end of the capacitance C2 and the other end of the resistor R3 are connected.

Here, a filter circuit at a rear stage is constituted by the differential amplifier AMP2, the capacitance C2, and the resistor R3 as same as described above, and this corresponds to the tertiary characteristics filter 55, and the transistor T1 corresponds to the power control circuit 56 shown in FIG. 3.

A second terminal of the switch SWA is connected to one end of the bypass line BL, and a second terminal of the switch SWB is connected to the other end of a bypass line BL. A first terminal of the switch SWB is connected to an output terminal OUT. Besides, one end of a resistor R4 is connected to a second terminal of the switch SWC, and the other end is connected to a first terminal of the switch SWB via a switch SWD.

Incidentally, only circuits at the positive input side and the positive output side of the differential amplifiers AMP1, AMP2 are shown in FIG. 4, but it is similarly constituted as for a negative input side and a negative output side.

In the circuits shown in FIG. 4, when only the filter circuit at the front stage constituted by the differential amplifier AMP1, the capacitance C1, and the variable resistor R2 is operated, the switches SWA, SWB are controlled so that the first terminal and the second terminal are to be connected, and the switches SWC, SWD are to be opened. Herewith, a signal inputted from an input terminal Vin is performed the filter process in the filter circuit at the front stage, and thereafter, it is outputted from the output terminal OUT via the bypass line BL.

Besides, the transistor T1 is made to be an off state by the control signal SC. Herewith, the filter circuit at the rear stage constituted by the differential amplifier AMP2, the capacitance C2, and the resistor R3 is not supplied with the power source, to thereby prevent a power consumption thereof.

On the other hand, when the filter circuit at the rear stage is operated in addition to the filter circuit at the front stage, the switches SWA, SWB are controlled so that the first terminal and the third terminal are to be connected, and the switches SWC, SWD are to be closed. Besides, at this time, the transistor T1 is made to be an ON state by the control signal SC, to supply the power source to the filter circuit at the rear stage. Herewith, a signal inputted from the input terminal Vin is performed the filter process in the filter circuit at the front stage, and thereafter, further performed the filter process in the filter circuit at the rear stage. The signal filter processed in the filter circuit at the rear stage is outputted from the output terminal OUT, and it is fed back to the filter circuit at the front stage via the resistor R4.

The operations of the filter 31 shown in FIG. 3 are described with returning to FIG. 3.

At first, when the first radio method (the damping characteristic of the filter is the quintic characteristics) is selected, an output of the secondary characteristics filter 53 and an input of the tertiary characteristics filter 55 are connected via the switch SW3, and an output of the tertiary characteristics filter 55 and the output node 57 are connected via the switch SW4 based on the control signal CTL supplied from the signal processing portion 41. Besides, the power control circuit 56 supplies the tertiary characteristics filter 55 with the power source in accordance with the control signal CTL showing that the first radio method is selected.

Herewith, a signal inputted from the input node 51 is sequentially performed the filter process by the secondary characteristics filter 53 and the tertiary characteristics filter 55, namely the filter process as same as the quintic characteristics filter is performed, to be outputted from the output node 57. Incidentally, the cut-off frequency is controlled appropriately by the cut-off frequency adjusting circuit 54.

On the other hand, when the second radio method (the damping characteristic of the filter is the secondary characteristics) is selected, the output of the secondary characteristics filter 53 and one end of the bypass line BL are connected via the switch SW3, and the other end of the bypass line BL and the output node 57 are connected via the switch SW4 based on the control signal CTL supplied from the signal processing portion 41. Besides, the power control circuit 56 interrupts the power supply to the tertiary characteristics filter 55 in accordance with the control signal CTL showing that the second radio method is selected.

Herewith, a signal inputted from the input node 51 is performed the filter process by the secondary characteristics filter 53, and thereafter, outputted from the output node 57 via the bypass line BL. Incidentally, at this time also, the cut-off frequency is controlled appropriately by the cut-off frequency adjusting circuit 54.

As stated above, when a high quintic characteristics filter is requested, both the secondary characteristics filter 53 and the tertiary characteristics filter 55 are operated, and when a low secondary characteristics filter is requested, only the secondary characteristics filter 53 is operated and the power supply to the tertiary characteristics filter 55 is interrupted. Herewith, it becomes possible to suppress an increase of a circuit scale by sharing the secondary characteristics filter 53 with two radio methods, and to switch the damping characteristics of the filter appropriately in accordance with the radio methods. Besides, a waste of electric power can be prevented by interrupting the power supply to the tertiary characteristics filter 55 in accordance with the radio method, to thereby reduce the power consumption.

—ADC32—

Next, the ADC32 is described.

In the following description, a 10-bit performance is requested in the first radio method, and an 8-bit performance is requested in the second radio method.

Figure 5:
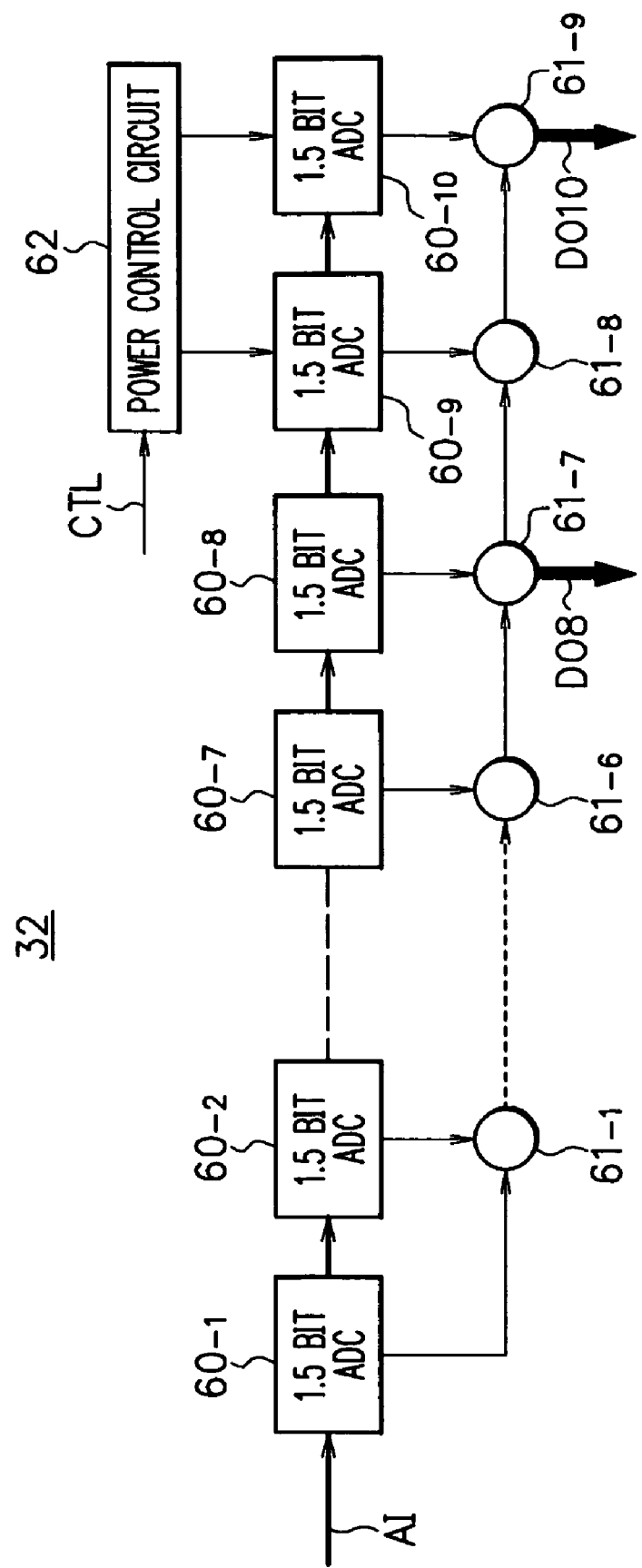
FIG. 5 is a block diagram showing a configuration example of an AD converter according to the first embodiment.

FIG. 5 is a view showing a configuration example of the ADC 32 adopting a pipeline method.

As shown in FIG. 5, the ADC 32 has AD conversion circuits $60_{-i}$ ("i" is a subscript, i=1 to 10) adding circuits $61_{-j}$ ("j" is a subscript, j=1 to 9) provided respectively so as to correspond to the AD conversion circuits $60_{-i}$ (i=2 to 10), and a power control circuit 62.

The AD conversion circuit $60_{-i}$ is subordinately connected, compares a reference voltage with an inputted input voltage to determine a digital data (one bit) and outputs to the corresponding adding circuit $61_{-j}$, and outputs a residual signal to the AD conversion circuit $60_{-i}$ connected at the next stage. The adding circuit $61_{-j}$ is also subordinately connected, adds the digital data supplied from the AD conversion circuit $60_{-i}$ by bit shifting the digital data from the adding circuit $61_{-j}$ at the front stage appropriately, and outputs an added result to the adding circuit $61_{-j}$ at the next stage. Besides, the power control circuit 62 switches whether the power source is supplied to the AD conversion circuits $60_{-9}$, $60_{-10}$ in accordance with the control signal CTL.

Next, operations of the ADC 32 is described.

When the first radio method (10-bit) is selected, the power control circuit 62 supplies the power source to the AD conversion circuits $60_{-9}$, $60_{-10}$ in accordance with the control signal CTL supplied from the signal processing portion 41 showing that the first radio method is selected. Namely, the power source is supplied to all of the AD conversion circuits $60_{-1}$ to $60_{-10}$.

The AD conversion circuit $60_{-1}$ compares a voltage of an inputted analog signal AI with the reference voltage to determine a value of the most significant bit (MSB) of a digital data, and outputs to the adding circuit $61_{-1}$. Besides, the AD conversion circuit $60_{-1}$ outputs the residual signal to the AD conversion circuit $60_{-2}$.

Subsequently, the AD conversion circuit $60_{-2}$ compares the voltage of the residual signal from the AD conversion circuit $60_{-1}$ with the reference voltage to determine a value of a second bit from the most significant bit side of the digital data, outputs to the adding circuit $61_{-1}$, and outputs the residual signal to the AD conversion circuit $60_{-3}$. The adding circuit $61_{-1}$ makes the bit shift of the output from the AD conversion circuit $60_{-1}$, adds the output from the AD conversion circuit $60_{-2}$ to this, and outputs a calculated result to the adding circuit $61_{-2}$.

Subsequently, the determination of the digital data value by the AD conversion circuit $60_{-i}$, the adding calculation by the adding circuit $61_{-j}$ are sequentially performed until a final stage in the same way. Herewith, the inputted analog signal AI is converted into a digital data with 10 bits, and the value is outputted from the adding circuit $61_{-9}$ as a digital signal DO10.

On the other hand, when the second radio method (8-bit) is selected, the power control circuit 62 interrupts the power source to the AD conversion circuits $60_{-9}$, $60_{-10}$ in accordance with the control signal CTL supplied from the signal processing portion 41 showing that the second radio method is selected.

The determinations of the digital data value by the AD conversion circuits $60_{-1}$ to $60_{-8}$, the adding calculations by the adding circuits $61_{-1}$ to $61_{-7}$ are sequentially performed as same as the above-stated case when the first radio method is selected. Herewith, the inputted analog signal AI is converted into a digital data with 8 bits, and the value is outputted from the adding circuit $61_{-7}$ as a digital signal DO8.

As stated above, when a high resolution performance (10-bit) is requested, all of the AD conversion circuits $60_{-j}$ (the AD conversion circuits $60_{-1}$ to $60_{-8}$ corresponding for the 8 bits, and the AD conversion circuits $60_{-9}$, $60_{-10}$ corresponding for the 2 bits connected thereto in series) are operated, and when a low resolution performance (8-bit) is requested, the AD conversion circuits $60_{-1}$ to $60_{-8}$ are operated, and the power supplies to the AD conversion circuits $60_{-9}$, $60_{-10}$ are interrupted. Herewith, it becomes possible to suppress the increase of the circuit scale by sharing the AD conversion circuits $60_{-1}$ to $60_{-8}$ operated when the low resolution performance is requested with the two radio methods. Besides, the resolution performances can be switched appropriately in accordance with the radio methods, and the waste of electric power can be prevented and the power consumption can be reduced.

Incidentally, in FIG. 5, the ADC 32 is constituted by using the 1.5 bit AD conversion circuits, but it is not limited to the 1.5 bit AD conversion circuits, and can be constituted by using 2.5 bit AD conversion circuits or 3.5 bit AD conversion circuits in accordance with use applications (power consumption, conversion time, and so on). Besides, the ADC 32 can be constituted by mixing the AD conversion circuits having different number of bits.

—DAC33—

Next, the DAC 33 is described.

In the following description, a 13-bit performance is requested in the first radio method and a 11-bit performance is requested in the second radio method.

Figure 6:
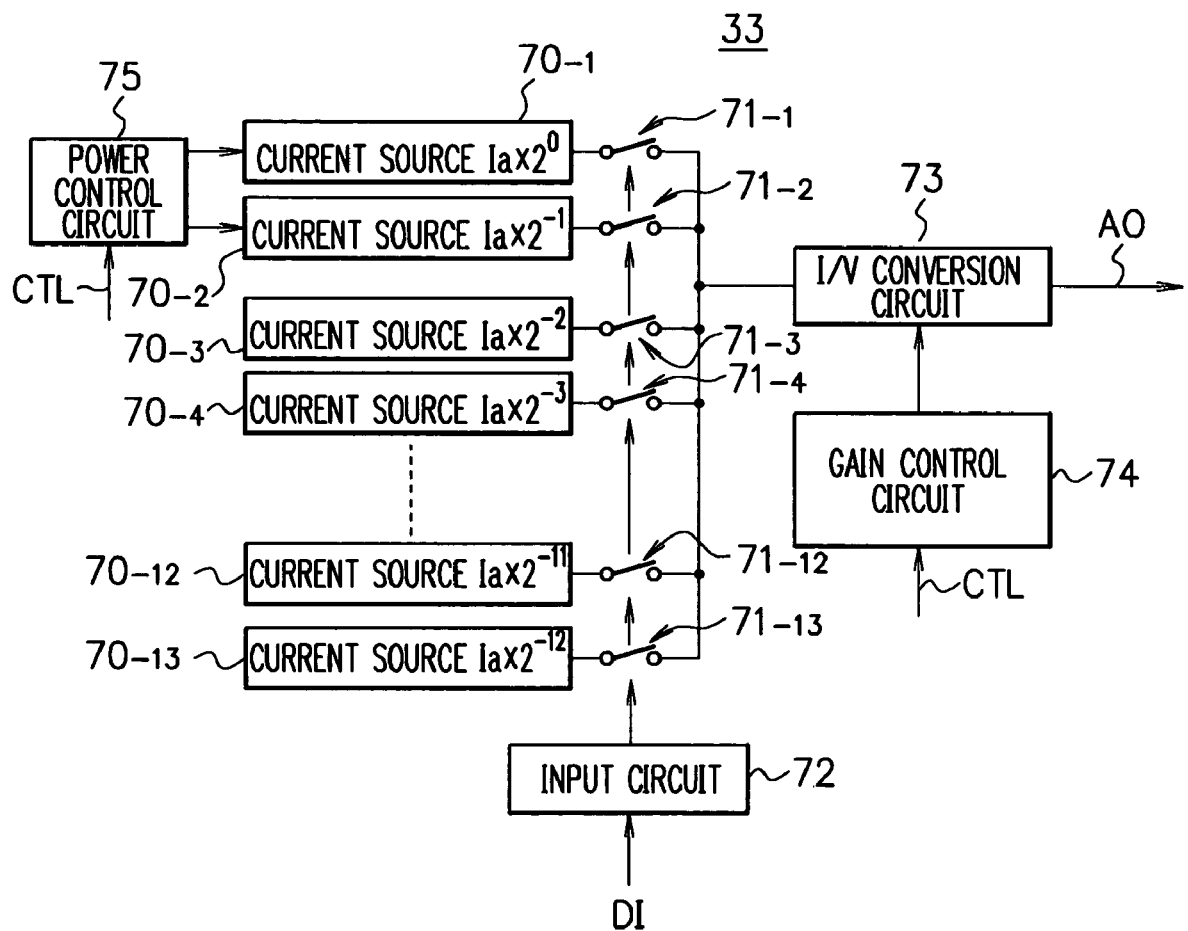
FIG. 6 is a block diagram showing a configuration example of a DA converter according to the first embodiment.
Figure 8:
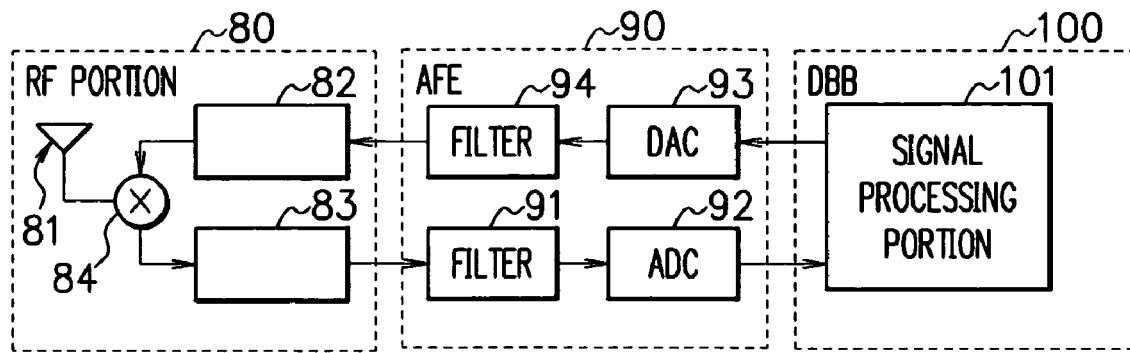
FIG. 8 is a block diagram showing a configuration of a conventional radio terminal.
Figure 9:
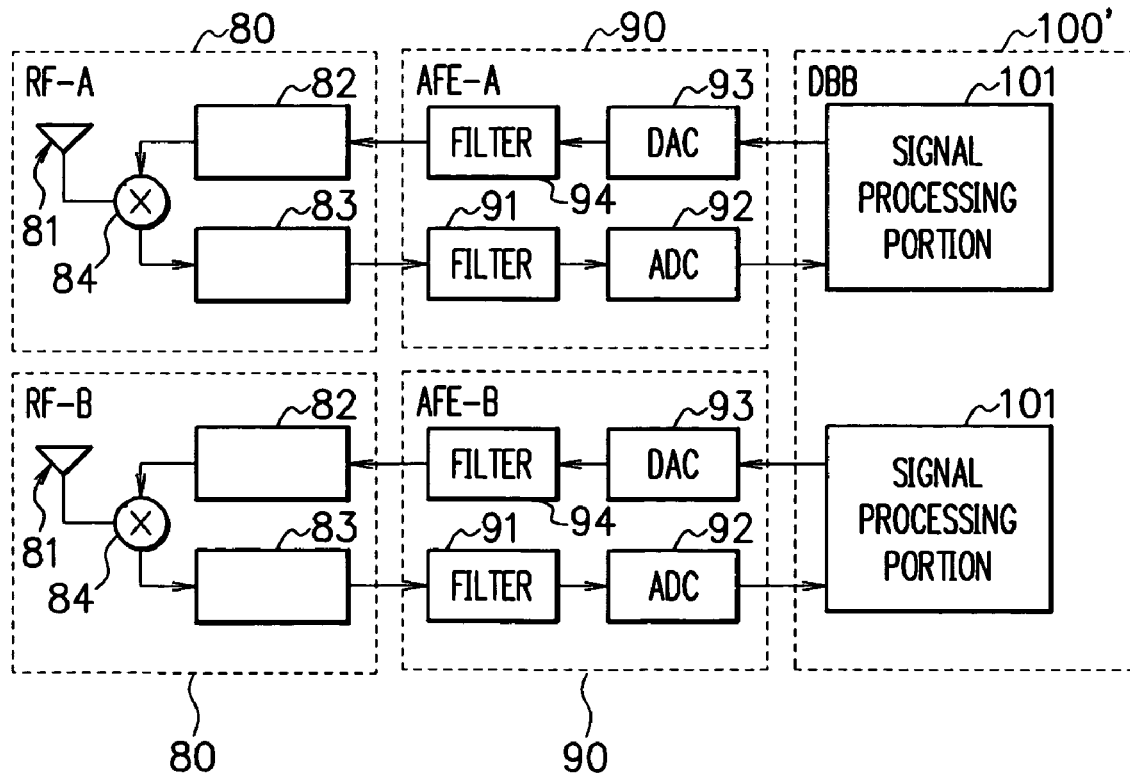
FIG. 9 is a block diagram showing a configuration of a conventional radio terminal corresponding to two radio methods.

FIG. 6 is a view showing a configuration example of a current adding type DAC 33.

As shown in FIG. 6, the DAC 33 has current sources $70_{-k}$ ("k" is a subscript, k=1 to 13), two-terminal switches $71_{-k}$ provided respectively so as to correspond to the current sources $70_{-k}$, an I/V (current-voltage) conversion circuit 73, a gain control circuit 74, an input circuit 72, and a power control circuit 75.

The current sources $70_{-k}$ supply the current of $Ia \times 2^{-(k-1)}$ respectively. One of the terminals of the switch $71_{-k}$ is connected to the current source $70_{-k}$, and the other terminal is commonly connected to the I/V conversion circuit 73. The I/V conversion circuit 73 converts and outputs the current supplied from the current source $70_{-k}$ via the switch $71_{-k}$ into a voltage. A gain control of the I/V conversion circuit 73 is performed by the gain control circuit 74 in accordance with the control signal CTL.

The input circuit 72 performs an open/close control of the switch $71_{-k}$ based on an inputted digital signal DI. For example, when a value of the least significant bit (LSB) of the inputted digital signal is "1", the switch $71_{-13}$ is controlled to be closed, and when it is "0", the switch $71_{-13}$ is controlled to be opened. Similarly, for example, when a value of the 10th bit from the lower side of the inputted digital signal is "1", the switch $71_{-4}$ is controlled to be closed and when it is "0", the switch $71_{-4}$ is controlled to be opened.

Besides, the power control circuit 75 switches whether the power source is supplied to the current sources $70_{-1}$, $70_{-2}$ or not. Concretely speaking, when the first radio method (13-bit) is selected, the power control circuit 75 supplies the power source to the current sources $70_{-1}$, $70_{-2}$ in accordance with the control signal CTL supplied from the signal processing portion 41 showing that the first radio method is selected. On the other hand, when the second radio method (11-bit) is selected, the power control circuit 75 interrupts the power source to the current sources $70_{-1}$, $70_{-2}$.

By constituting as stated above, the switch $71_{-k}$ is open/close controlled based on the inputted digital signal DI, and the current in accordance with the digital signal DI is supplied to the I/V conversion circuit 73. The current-voltage conversion is performed at the I/V conversion circuit 73, and an analog signal AO having a voltage in accordance with the value of the digital signal DI is outputted. At this time, the power supplies to the current sources $70_{-1}$, $70_{-2}$ are interrupted in accordance with the selected radio method.

Herewith, the current sources $70_{-3}$ to $70_{-13}$ operated when a low performance (11-bit) is requested are shared with the two radio methods to thereby enable to suppress the increase of the circuit scale. Besides, circuit characteristics can be switched appropriately in accordance with the radio methods, and the power consumption can be reduced by preventing a waste of electric power.

As described above, according to the first embodiment, a part of the analog circuits operated when a communication is performed in the second radio method are shared with the analog circuits operated when the communication is performed in the first radio method, in the filters 31, 34, the ADC 32, and the DAC 33. Consequently, it becomes possible to switch the circuit characteristics appropriately in accordance with the radio methods while suppressing the increase of the circuit area, and for example, a radio terminal device can be miniaturized easily. Besides, when the communication is performed in the first radio method, the power supply to the circuit portion operated only when the communication is performed in the second radio method is interrupted, and thereby, the power consumption can be reduced.

Incidentally, in the above-stated description, the radio method is selected by a user, but for example, it is possible to automatically switch an optimum radio method in accordance with a communication environment without awareness of the user, by switching the radio method automatically at a time of standby and confirming the respective communication environment.

Besides, in the above-stated description, the case when two radio methods are used is described as an example, but the present invention is not limited to two radio methods, but is applicable to a case when it is corresponded to plural radio methods.

Second Embodiment

Next, a second embodiment is described.

A radio terminal device applying a semiconductor device according to the second embodiment of the present invention is to switch circuit characteristics in accordance with a communication environment (quality and so on of a receiving signal) Incidentally, an entire configuration of the radio terminal device according to the second embodiment of the present invention is the same as the radio terminal device according to the first embodiment except a point that it has only one RF portion, and therefore, the description thereof is not given.

Communication characteristics of the radio terminal device change in accordance with the communication environment it is placed in. For example, there is an area near a base station and a radio environment thereof is relatively good, and on the contrary, there is also an area of which radio environment is bad such as the area far from the base station. In the area with the bad radio environment, a desired signal level according to the communication is lowered, a portion of a noise in the receiving signal becomes large compared to the area with a good radio environment, to thereby deteriorate the quality of the receiving signal. Depending on circumstances, a situation of a channel cut may occur.

Consequently, in the second embodiment of the present invention, when a damping characteristic of, for example, a quartic characteristics filter as shown by a dotted line "RB'" in FIG. 7 is requested for the radio terminal device, and 6-bit is requested as a resolution of the ADC 32, the filter 31 is constituted by filters having a higher degree damping characteristic than the quartic (for example, a quintic characteristics filter) adjusted in advance so that a cut-off frequency (Fc) thereof does not fluctuate as shown by a solid line "RA'" in FIG. 7, and the ADC 32 is constituted by ADCs having a higher resolution than 6-bit (the number of bits is large) (for example, an ADC having a 8-bit resolution).

Incidentally, the filter 31 and the ADC 32 may be constituted as same as the above-stated first embodiment. Namely, in the filter 31, the quartic characteristics filter and a primary characteristics filter are made to be connectable in series, and in the ADC 32, the AD conversion circuits for 6 bits and the AD conversion circuits for 2 bits are made to be connectable in series.

At a normal time, in the filter 31, the quartic characteristics filter is operated, and in the ADC 32, only the AD conversion circuits for 6 bits are operated. Besides, at this time, power supplies to the primary filter corresponding to the quintic portion in the filter 31 and the AD conversion circuits for 2 bits corresponding to the 7th, 8th bits portions in the ADC 32 are interrupted so as to prevent a waste of electrical power.

On the other hand, when the quality of the receiving signal is lowered caused by a deterioration of the communication environment and so on, the filter 31 operates both the quartic characteristics filter and the primary characteristics filter. Namely, the filter 31 is made to be the quintic characteristics filter to make the damping characteristic of the filter steep. As stated above, it is possible to improve the quality of the receiving signal by preventing interferences by other signals, for example, signals and so on of other users, and making a noise small.

Besides, the ADC 32 operates all of the AD conversion circuits for 8 bits. Herewith, the resolution of the ADC 32 becomes high, and the quality of the receiving signal can be improved by making use of information of a portion normally discarded (information in 7th and 8th bits in the present embodiment).

Here, the deterioration of the quality of the receiving signal can be detected by measuring a signal level of the receiving signal, a BER (Bit Error Rate), or an S/N ratio (Signal to Noise ratio). Incidentally, the signal level of the receiving signal can be detected at the receiving amplifier portion of the RF portion shown in FIG. 1, the BER can be detected at the DBB portion having an error correction decoding function, and the S/N ratio can be detected at the RF portion.

As described above, according to the second embodiment, the number of degrees of the filter 31 (the damping characteristics of the filter) and the resolution of the ADC 32 are adaptively controlled into a requisite minimum in accordance with the quality of the receiving signal. Consequently, the quality of the receiving signal can be improved by switching the circuit characteristics, and a stable communication can be performed even under a state of bad communication environment. Besides, the power consumption can be reduced by interrupting the power supplies to the circuits which are not necessary to be operated in the filter 31 and the ADC 32 in accordance with the quality of the receiving signal. For example, in case of a radio terminal device operated by a battery, it is possible to increase a calling time and a standby time.

Incidentally, the constitution of the filters 31, 34, the ADC 32, and the DAC 33 described in the above-stated first and second embodiments is an example, and the number of degrees of the filters 31, 34 and the resolution performances of the ADC 32 and the DAC 33 are arbitrary. These performance values are determined appropriately in accordance with the radio methods, the communication environment, and so on to be corresponded, and the filters 31, 34, the ADC 32, and the DAC 33 may be constituted as same as the above-stated description.

Besides, the above-stated embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

INDUSTRIAL APPLICABILITY

As stated above, according to the present invention, a first performance is realized by operating a first analog circuit adapted to the first performance, and interrupting a power supply to a second analog circuit in which a second performance higher than the first performance is realized by cooperating with the first analog circuit. The second performance is realized by operating the first analog circuit and the second analog circuit together. Herewith, an increase of a circuit scale is suppressed by sharing the first analog circuit, circuit characteristics can be switched in accordance with the requested performance, and it is easy to be miniaturized. Besides, a power consumption can be reduced by interrupting the power supply to the analog circuit which is not necessary to be operated.

What is claimed is:

1. A semiconductor device, comprising:
   a first analog circuit in which circuit characteristics are adapted to a first performance; and
   a second analog circuit realizing a second performance higher than the first performance by cooperating with said first analog circuit, and a power supply thereto is interrupted when the first performance is requested,
   wherein in the case when the first performance is requested, said semiconductor device outputs an operation result of said first analog circuit, and
   in the case when the second performance is requested, said semiconductor device combines operation results of said first analog circuit and said second analog circuit and outputs combined operation results.

2. The semiconductor device according to claim 1, further comprising:
   a power control circuit interrupting the power supply to said second analog circuit when the first performance is requested, and supplying said second analog circuit with a power source when the second performance is requested.

3. The semiconductor device according to claim 1, wherein said first analog circuit and said second analog circuit are filters.

4. The semiconductor device according to claim 3, wherein said first analog circuit is a first filter, and
   said second analog circuit is a second filter in which an input terminal thereof is connectable to an output terminal of the first filter.

5. The semiconductor device according to claim 3, further comprising:
a cut-off adjusting circuit adjusting a cut-off frequency of the filter in accordance with a requested performance.

6. The semiconductor device according to claim 1, wherein said first analog circuit and said second analog circuit are an AD converter.

7. The semiconductor device according to claim 6, wherein said first analog circuit is a first AD converter, and said second analog circuit is a second AD converter connected to the first AD converter in series.

8. The semiconductor device according to claim 1, wherein said first analog circuit and said second analog circuit are a DA converter.

9. The semiconductor device according to claim 8, wherein said first analog circuit is a first DA converter, and said second analog circuit is a second DA converter commonly connected to an output of the first DA converter.

10. The semiconductor device according to claim 1, wherein said first analog circuit and said second analog circuit have the filters, the AD converter, and the DA converter, and
wherein the filter is composed of the first filter and the second filter capable of being connected in series,
the AD converter is composed of the first AD converter and the second AD converter connected in series, and
the DA converter is composed of the first DA converter and the second DA converter in which outputs thereof are commonly connected, and
wherein power supplies to the second filter, the second AD converter, and the second DA converter are interrupted when the first performance is requested.

11. A semiconductor device, which is used for receiving both a signal in a first radio method in which a first performance is requested, and a signal in a second radio method in which a second performance higher than the first performance is requested, the semiconductor device comprising:
a first analog circuit in which circuit characteristics are adapted to the first performance;
a second analog circuit realizing the second performance by cooperating with said first analog circuit, and
a power control circuit interrupting a power supply to said second analog circuit when the signal in the first radio method is received, and supplying said second analog circuit with a power source when the signal in the second radio method is received,
wherein in the case when the signal in the first radio method is received, said semiconductor device outputs an operation result of said first analog circuit, and
in the case when the signal in the second radio method is received, said semiconductor device combines operation results of said first analog circuit and said second analog circuit and outputs combined operation results.

12. The semiconductor device according to claim 11, wherein said first analog circuit and said second analog circuit include at least one of a filter, an AD converter, and a DA converter.

13. A semiconductor device used at a receiving side in a radio communication, comprising:
a first analog circuit having a first performance;
a second analog circuit realizing a performance higher than the first performance by cooperating with said first analog circuit; and
a power control circuit capable of switching a first state in which a power source is supplied to said first analog circuit and a power supply is interrupted to said second analog circuit, and a second state in which the power source is supplied to both said first analog circuit and said second analog circuit, in accordance with a quality of a receiving signal in the radio communication,
wherein in the first state, said semiconductor device outputs an operation result of said first analog circuit, and
in the second state, said semiconductor device combines operation results of said first analog circuit and second analog circuit and outputs combined operation results.

14. The semiconductor device according to claim 13, wherein said first analog circuit and said second analog circuit have at least one of a filter and an AD converter.

15. A radio terminal device, comprising:
a first analog circuit in which circuit characteristics are adapted to a first performance, and a signal process according to a radio communication is performed; and
a second analog circuit in which the signal process according to the radio communication is performed in a second performance higher than the first performance by cooperating with said first analog circuit, and a power supply thereto is interrupted when the first performance is requested,
wherein in the case when the first performance is requested, said radio terminal device outputs an operation result of said first analog circuit, and
in the case when the second performance is requested, said radio terminal device combines operation results of said first analog circuit and said second analog circuit outputs combined operation results.

16. A radio communication equipment, comprising:
a high frequency portion performing a high frequency signal process;
an analog processing portion performing an analog signal process; and
a base band processing portion performing a base band signal process, and
wherein said analog processing portion including:
a first analog circuit in which circuit characteristics have a first performance; and
a second analog circuit realizing a second performance higher than the first performance by cooperating with the first analog circuit, and a power supply thereto is interrupted when the first performance is requested,
wherein in the case when the first performance is requested, said analog processing portion outputs an operation result of said first analog circuit, and
in the case when the second performance is requested, said analog processing portion combines operation results of said first analog circuit and said second analog circuit and outputs combined operation results.

* * * * *

UNITED STATES PATENT AND TRADEMARK OFFICE
CERTIFICATE OF CORRECTION

| | | |
|---|---|---|
| PATENT NO. | : 7,684,780 B2 | |
| APPLICATION NO. | : 11/402936 | |
| DATED | : March 23, 2010 | |
| INVENTOR(S) | : Kenichi Minobe et al. | |

It is certified that error appears in the above-identified patent and that said Letters Patent is hereby corrected as shown below:

ON THE TITLE PAGE-

In Item (65) Prior Publication Data, please add

--Continuation of Application No. PCT/JP2003/014289, filed on November 11, 2003--.

Signed and Sealed this

Thirty-first Day of August, 2010

David J. Kappos
*Director of the United States Patent and Trademark Office*